(12) United States Patent
Huang

(10) Patent No.: US 12,439,647 B2
(45) Date of Patent: Oct. 7, 2025

(54) SEMICONDUCTOR DEVICE AND MANUFACTURING METHOD THEREOF

(71) Applicant: AUO Corporation, Hsinchu (TW)

(72) Inventor: Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 462 days.

(21) Appl. No.: 17/988,767

(22) Filed: Nov. 17, 2022

(65) Prior Publication Data
US 2023/0187556 A1    Jun. 15, 2023

Related U.S. Application Data

(60) Provisional application No. 63/287,695, filed on Dec. 9, 2021.

(30) Foreign Application Priority Data

Jun. 20, 2022 (TW) .................................. 111122796

(51) Int. Cl.
H10D 30/67      (2025.01)
H01L 21/02      (2006.01)
(Continued)

(52) U.S. Cl.
CPC ... *H10D 30/6755* (2025.01); *H01L 21/02565* (2013.01); *H01L 21/383* (2013.01); *H01L 21/426* (2013.01); *H10D 30/6734* (2025.01); *H10D 30/6757* (2025.01); *H10D 99/00* (2025.01)

(58) Field of Classification Search
CPC ........... H10D 30/6734; H10D 30/6757; H10D 30/031; H10D 30/673; H10D 86/021; H10D 86/60; H10D 30/6755; H10D 86/423; H01L 21/02565
See application file for complete search history.

(56) References Cited

U.S. PATENT DOCUMENTS 6,023,090 A * 2/2000 Letavic ............... H10D 30/657
                                                257/E29.279
10,153,304 B2  12/2018 Qin
(Continued)

FOREIGN PATENT DOCUMENTS

CN      1484297         3/2004
CN      103346093      10/2013
(Continued)

*Primary Examiner* — Julia Slutsker
(74) *Attorney, Agent, or Firm* — JCIPRNET

(57) ABSTRACT

A semiconductor device includes a substrate, a semiconductor structure, a gate dielectric layer, a first gate, a source and a drain. The semiconductor structure is disposed above the substrate. The semiconductor structure includes a first thick portion, a second thick portion, and a thin portion between the first thick portion and the second thick portion. The gate dielectric layer is disposed on the semiconductor structure. The first gate is disposed on the gate dielectric layer. The first gate overlaps a portion of the first thick portion and a portion of the thin portion. The first gate does not overlap another portion of the thin portion and the second thick portion. The source is electrically connected to the first thick portion. The drain is electrically connected to the second thick portion.

12 Claims, 12 Drawing Sheets

(51) Int. Cl.
*H01L 21/383* (2006.01)
*H01L 21/426* (2006.01)
*H10D 99/00* (2025.01)

(56) References Cited

U.S. PATENT DOCUMENTS

2016/0240684 A1* 8/2016 Yamazaki ............. H01L 21/477
2018/0182783 A1 6/2018 Qin

FOREIGN PATENT DOCUMENTS

| CN | 106158978 | 11/2016 |
| CN | 107093557 | 8/2017 |

* cited by examiner

SEMICONDUCTOR DEVICE AND MANUFACTURING METHOD THEREOF

CROSS-REFERENCE TO RELATED APPLICATION

This application claims the priority benefit of U.S. provisional application Ser. No. 63/287,695, filed on Dec. 9, 2021, and Taiwan application serial no. 111122796, filed on Jun. 20, 2022. The entirety of each of the above-mentioned patent applications is hereby incorporated by reference herein and made a part of this specification.

BACKGROUND

Technical Field

The disclosure relates to a semiconductor device and a manufacturing method thereof.

Description of Related Art

Generally speaking, the semiconductor layer of a thin film transistor may be divided into a channel region and a doped region. If the carrier concentration of the doped region is high, and there is a sudden drop in the carrier concentration between the doped region and the channel region, a high lateral electric field will appear near the drain of the thin film transistor during high current operation and causes deterioration of the semiconductor device. However, if the carrier concentration of the doped region is reduced in order to avoid deterioration of the semiconductor device, the operating current of the semiconductor device will be insufficient. Therefore, how to reduce the lateral electric field near the drain of the semiconductor device while maintaining sufficient operating current performance is a problem that currently needs to be improved.

SUMMARY

The disclosure provides a semiconductor device and a manufacturing method thereof, which has sufficient operating current and may reduce the lateral electric field near the drain.

At least an embodiment of the disclosure provides a semiconductor device. The semiconductor device includes a substrate, a semiconductor structure, a gate dielectric layer, a first gate, a source, and a drain. The semiconductor structure is disposed on the substrate. The semiconductor structure includes a first thick portion, a second thick portion, and a thin portion located between the first thick portion and the second thick portion. A thickness of the first thick portion and the second thick portion is greater than a thickness of the thin portion. The gate dielectric layer is disposed on the semiconductor structure. The first gate is disposed on the gate dielectric layer. The first gate overlaps a portion of the first thick portion and a portion of the thin portion in a normal direction of a top surface of the substrate. The first gate does not overlap another portion of the thin portion and the second thick portion in the normal direction of the top surface of the substrate. The source is electrically connected to the first thick portion. The drain is electrically connected to the second thick portion.

At least an embodiment of the disclosure provides a manufacturing method of a semiconductor device, which includes: forming a semiconductor structure on a substrate, and the semiconductor structure includes a first thick portion, a second thick portion, and a thin portion located between the first thick portion and the second thick portion, and a thickness of the first thick portion and the second thick portion is greater than a thickness of the thin portion; forming a gate dielectric layer on the semiconductor structure; forming a first gate on the gate dielectric layer, and the first gate overlaps a portion of the first thick portion and a portion of the thin portion in a normal direction of a top surface of the substrate, and the first gate does not overlap another portion of the thin portion and the second thick portion in the normal direction of the top surface of the substrate; and forming a source electrically connected to the first thick portion and a drain electrically connected to the second thick portion.

DESCRIPTION OF EMBODIMENTS

Figure 1:
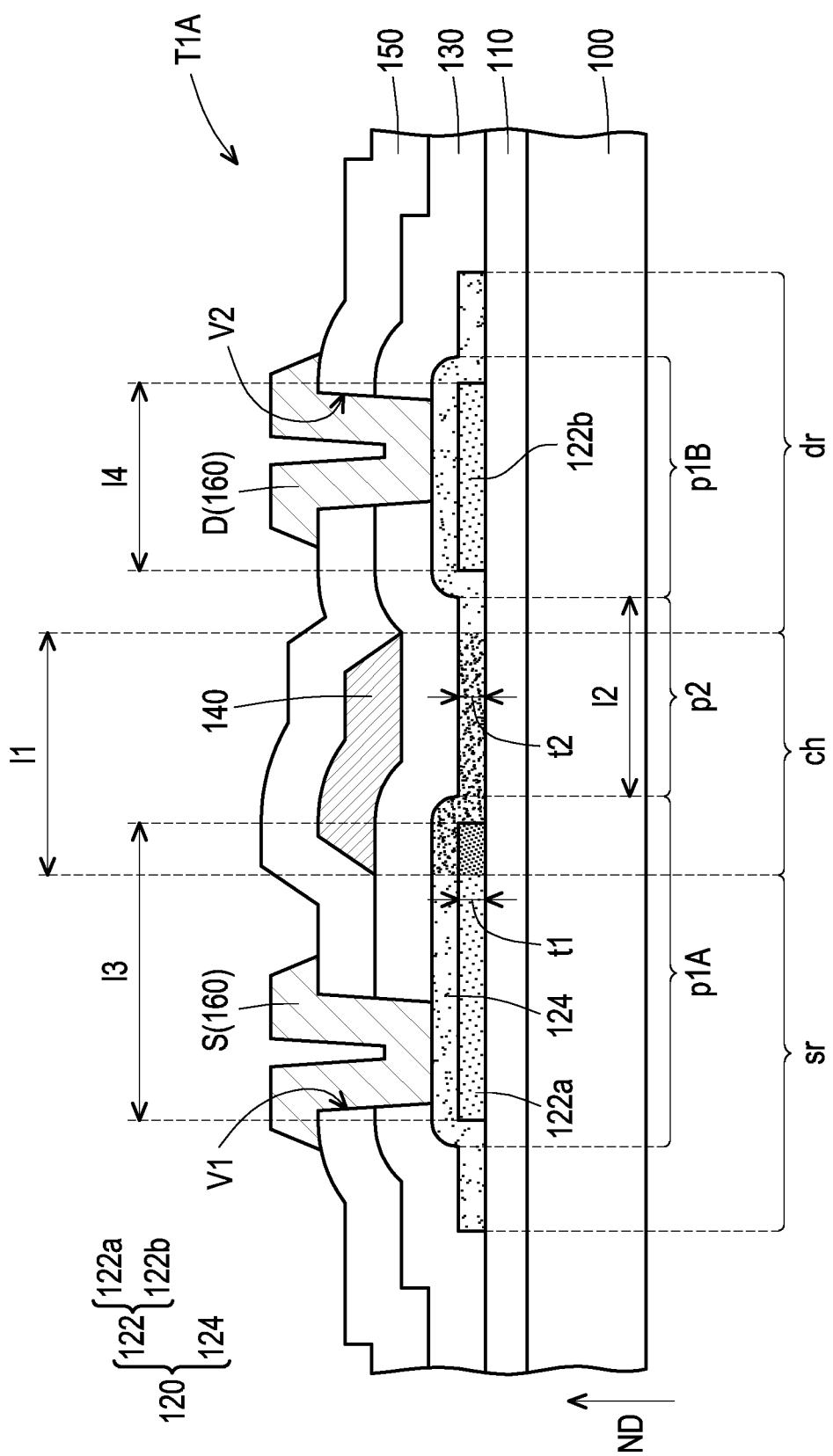
FIG. 1 is a schematic cross-sectional view of a semiconductor device according to an embodiment of the disclosure.

FIG. 1 is a schematic cross-sectional view of a semiconductor device according to an embodiment of the disclosure. With reference to FIG. 1, a semiconductor device T1A includes a substrate 100, a semiconductor structure 120, a gate dielectric layer 130, a first gate 140, a source S, and a drain D. In this embodiment, the semiconductor device T1A further includes a buffer layer 110 and an interlayer dielectric layer 150.

The material of the substrate 100 may be glass, quartz, organic polymers or opaque/reflective materials (such as conductive materials, metals, wafers, ceramics or other applicable materials) or other applicable materials. In some embodiments, the substrate 100 is a flexible substrate, and the material of the substrate 100 is, for example, polyethylene terephthalate (PET), polyethylene naphthalate (PEN), polyester (PES), polymethylmethacrylate (PMMA), polycarbonate (PC), polyimide (PI), metal foil or other flexible materials. The buffer layer 110 is located on the substrate 100, and the material of the buffer layer 110 may include silicon nitride, silicon oxide, silicon oxynitride or other suitable materials or stacked layers of the above materials, but the disclosure is not limited thereto.

The semiconductor structure 120 is disposed on the substrate 100 and the buffer layer 110. The semiconductor structure 120 includes a first thick portion p1A, a second thick portion p1B, and a thin portion p2 located between the first thick portion p1A and the second thick portion p1B, and the thickness of the first thick portion p1A and the second thick portion p1B is greater than that of the thin portion p2. In some embodiments, the outer sides of the first thick portion p1A and the second thick portion p1B away from the thin portion p2 also include other thin portions, so that the first thick portion p1A and the second thick portion p1B are respectively sandwiched between two corresponding thin portions.

The semiconductor structure 120 may include a first metal oxide layer 122 and a second metal oxide layer 124. The stacked portions of the first metal oxide layer 122 and the second metal oxide layer 124 may configure two thick portions of the semiconductor structure 120. For example, in this embodiment, the first metal oxide layer 122 includes a first island structure 122a and a second island structure 122b which are separated from each other. The second metal oxide layer 124 and the first island structure 122a are stacked on each other to form the first thick portion p1A, and the second metal oxide layer 124 and the second island structure 122b are stacked on each other to form the second thick portion p1B. In this embodiment, the length 13 of the first island structure 122a is different from the length 14 of the second island structure 122b, but the disclosure is not limited thereto. In other embodiments, the length 13 of the first island structure 122a is equal to the length 14 of the second island structure 122b.

The portion of the second metal oxide layer 124 between the first thick portion p1A and the second thick portion p1B may configure the thin portion p2. In other words, the thicknesses of the first thick portion p1A and the second thick portion p1B are substantially the sum of the thickness t1 of the first metal oxide layer 122 and the thickness t2 of the second metal oxide layer 124, and the thickness of the thin portion p2 is substantially equal to the thickness t2 of the second metal oxide layer 124. In some embodiments, the portions of the second metal oxide layer 124 located at the outer sides of the first thick portion p1A and the second thick portion p1B away from the thin portion p2 may also configure other thin portions.

The material of the semiconductor structure 120 includes quaternary metal compounds such as indium gallium tin zinc oxide (IGTZO), indium gallium zinc oxide (IGZO), indium tin zinc oxide (ITZO), aluminum zinc tin oxide (AZTO), and indium tungsten zinc oxide (IWZO), or includes oxides composed of ternary metals including any three of gallium (Ga), zinc (Zn), indium (In), tin (Sn), aluminum (Al), and tungsten (W) or lanthanide rare earth-doped metal oxides (such as Ln-IZO). In some embodiments, the first metal oxide layer 122 and the second metal oxide layer 124 may include the same metal element, but the disclosure is not limited thereto. In some embodiments, the thicknesses of the first metal oxide layer 122 and the second metal oxide layer 124 may be the same, for example, both being between 2 nm and 60 nm, but the disclosure is not limited thereto.

The gate dielectric layer 130 is disposed on the semiconductor structure 120 and the buffer layer 110. The first gate 140 is disposed on the gate dielectric layer 130. The first gate 140 overlaps a portion of the first thick portion p1A and a portion of the thin portion p2 in the normal direction ND of the top surface of the substrate 100, and the first gate 140 does not overlap another portion of the first thick portion p1A, another portion of the thin portion p2 and the second thick portion p2A in the normal direction ND. In some embodiments, the length 11 of the first gate 140 and the length 12 of the thin portion p2 are equal to or different from each other.

In this embodiment, the semiconductor structure includes a source region sr, a drain region dr, and a channel region ch between the source region sr and the drain region dr. The source region sr and the drain region dr are doped to have a lower resistivity than the channel region ch.

In this embodiment, the range of the channel region ch is defined by the first gate 140, and the channel region ch includes the portion of the first thick portion p1A overlapping the first gate 140 in the normal direction ND and the portion of the thin portion p2 overlapping the first gate 140 in the normal direction ND. Therefore, in this embodiment, the channel region ch includes a portion of the first island structure 122a and a portion of the second metal oxide layer 124.

The first gate 140 does not overlap a portion of the first thick portion p1A in the normal direction ND, and the source region sr includes the portion of the first thick portion p1A that does not overlap the first gate 140 in the normal direction ND. The first gate 140 does not overlap a portion of the thin portion p2 and the second thick portion p1B in the normal direction ND, and the drain region dr includes the portion of the thin portion p2 that does not overlap the first gate 140 in the normal direction ND and the second thick portion p1B. In some embodiments, the source region sr further includes other thin portions located at the outer sides of the first thick portion p1A away from the thin portion p2, and the drain region dr further includes other thin portions located at the outer sides of the second thick portion p1B away from the thin portion p2.

In this embodiment, since the thickness of the portion of the drain region dr close to the channel region ch is thinner, the resistivity of the portion of the drain region dr connected to the channel region ch may be reduced, thereby reducing the hot carrier effect caused by the lateral electric field in the drain region dr. In addition, since the thickness of the portion of the source region sr close to the channel region ch is thicker, the increase in resistivity of the source region sr due to the reduction in thickness may be avoided.

In addition, although there are portions with different thicknesses in the channel region ch, since most of the current in the channel region ch is conducted on the surface of the channel region ch, the thickness change of the channel region ch has little effect on the resistivity of the channel region ch. In this embodiment, by disposing the first thick portion p1A below the first gate 140, the connection portion between the first thick portion p1A and the thin portion p2 is located in the channel region ch. In some embodiments, the first island structure 122a partially overlaps the first gate 140 in the normal direction ND, so as to prevent the process offset from causing the connection portion of the first thick portion p1A and the thin portion p2 to deviate from the channel area ch.

The interlayer dielectric layer 150 is disposed on the gate dielectric layer 130 and covers the first gate 140. The materials of the interlayer dielectric layer 150 and the gate dielectric layer 130 are, for example, silicon oxide, silicon nitride, silicon oxynitride or other suitable materials. Vias V1 and V2 penetrate through the interlayer dielectric layer 150 and the gate dielectric layer 130, and the vias V1 and V2 respectively overlap the first thick portion p1A and the second thick portion p2B. A conductive layer 160 is located on the interlayer dielectric layer 150, and is filled in the vias V1 and V2 respectively to be electrically connected to the first thick portion p1A and the second thick portion p2B of the semiconductor structure 120. The conductive layer 160 may form the source S and the drain D. The source S is electrically connected to the source region sr through the via V1, and the drain D is electrically connected to the drain region dr through the via V2. In this embodiment, the source S and the drain D are connected to the second metal oxide layer 124. In some embodiments, the projection areas of the first thick portion p1A and the second thick portion p2B on the substrate 100 are larger than the contact area of the source S and the first thick portion p1A and the contact area of the drain D and the second thick portion p2B, respectively.

Based on the above, in addition to improving the hot carrier effect of the semiconductor device TIA, the resistivity of the source region sr of the semiconductor device TIA may be prevented from increasing, thereby increasing the operating current of the semiconductor device T1A and improving the overall performance and reliability of the semiconductor device TIA.

FIGS. 2A to 2D are schematic cross-sectional views of a manufacturing method of the semiconductor device of FIG. 1.

Figure 2A:
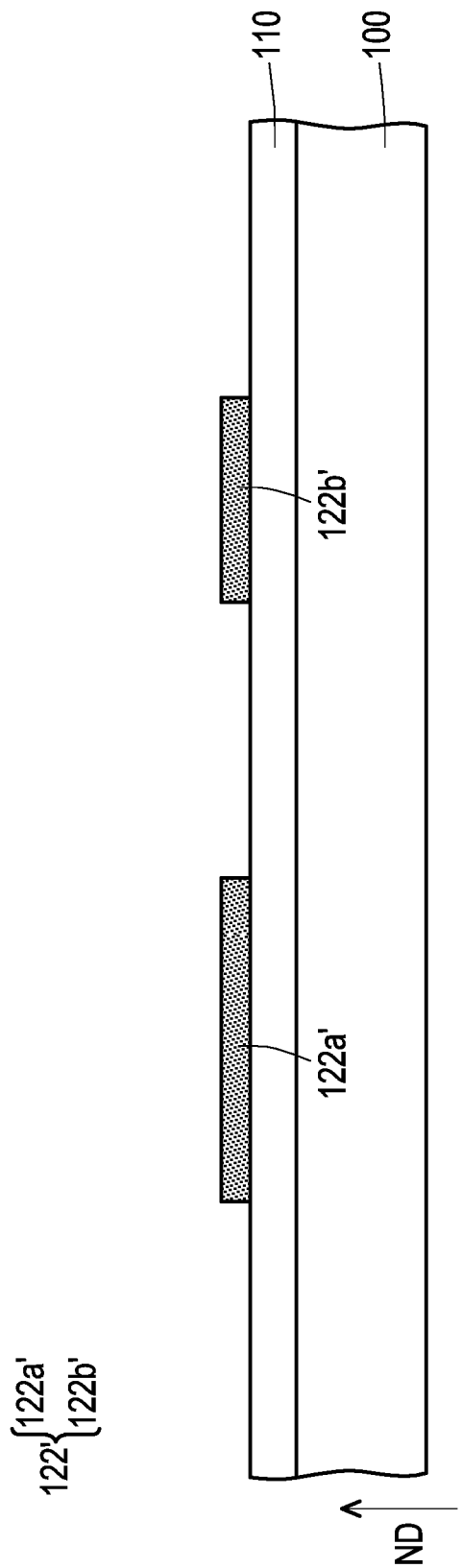
FIGS. 2A to 2D are schematic cross-sectional views of a manufacturing method of the semiconductor device of FIG. 1.
Figure 2B:
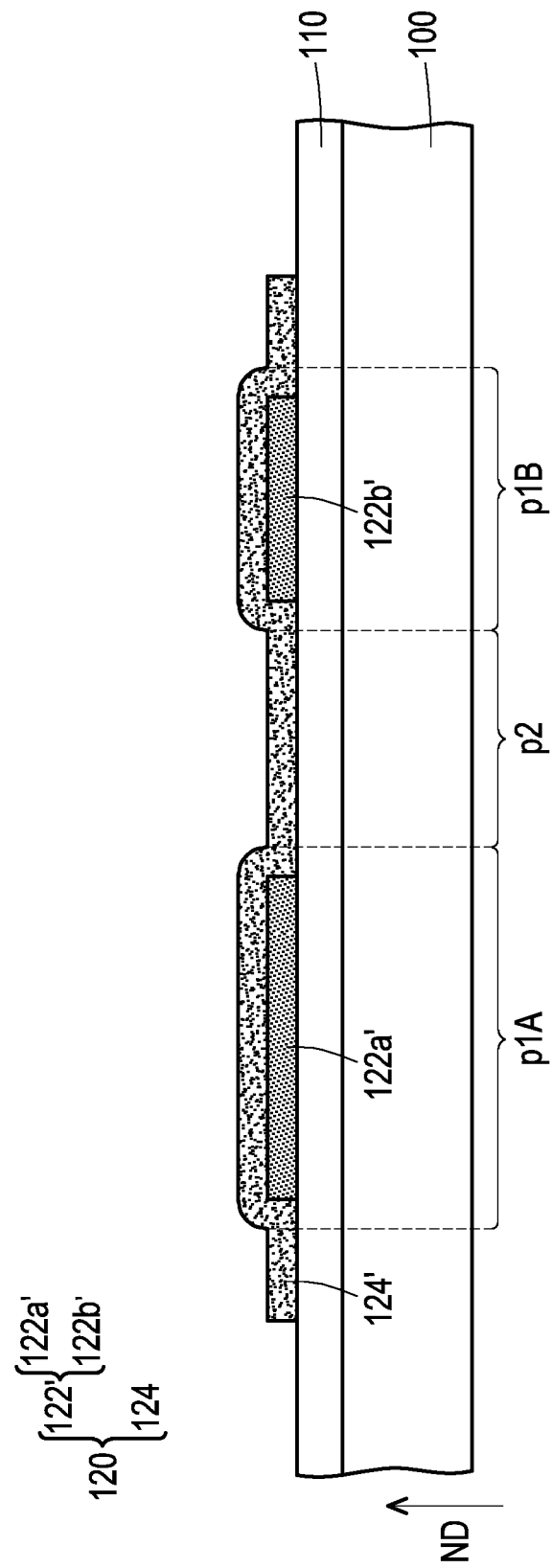

With reference to FIG. 2A and FIG. 2B, a semiconductor structure 120' is formed on the substrate 100. For example, the buffer layer 110 may be formed on the substrate 100 first, and then the semiconductor structure 120' may be formed on the buffer layer 110. The semiconductor structure 120' includes the first thick portion p1A, the second thick portion p1B, and the thin portion p2 between the first thick portion p1A and the second thick portion p1B.

In this embodiment, the method for forming the semiconductor structure 120' may be, for example, as shown in FIG. 2A, firstly forming a first metal oxide layer 122' on the buffer layer 110 and the substrate 100, and the first metal oxide layer 122' includes a first island structure 122a' and a second island structure 122b' which are separated from each other. Then, as shown in FIG. 2B, a second metal oxide layer 124' is formed on the first metal oxide layer 122'. In some embodiments, the second metal oxide layer 124' completely covers the first metal oxide layer 122', so as to prevent the patterning process of patterning the second metal oxide layer 124' from damaging the first metal oxide layer 122'.

In some embodiments, the oxygen concentration of the first metal oxide layer 122' is less than or equal to the oxygen concentration of the second metal oxide layer 124', thereby reducing the resistivity of the first thick portion p1A and the second thick portion p1B.

Figure 2C:
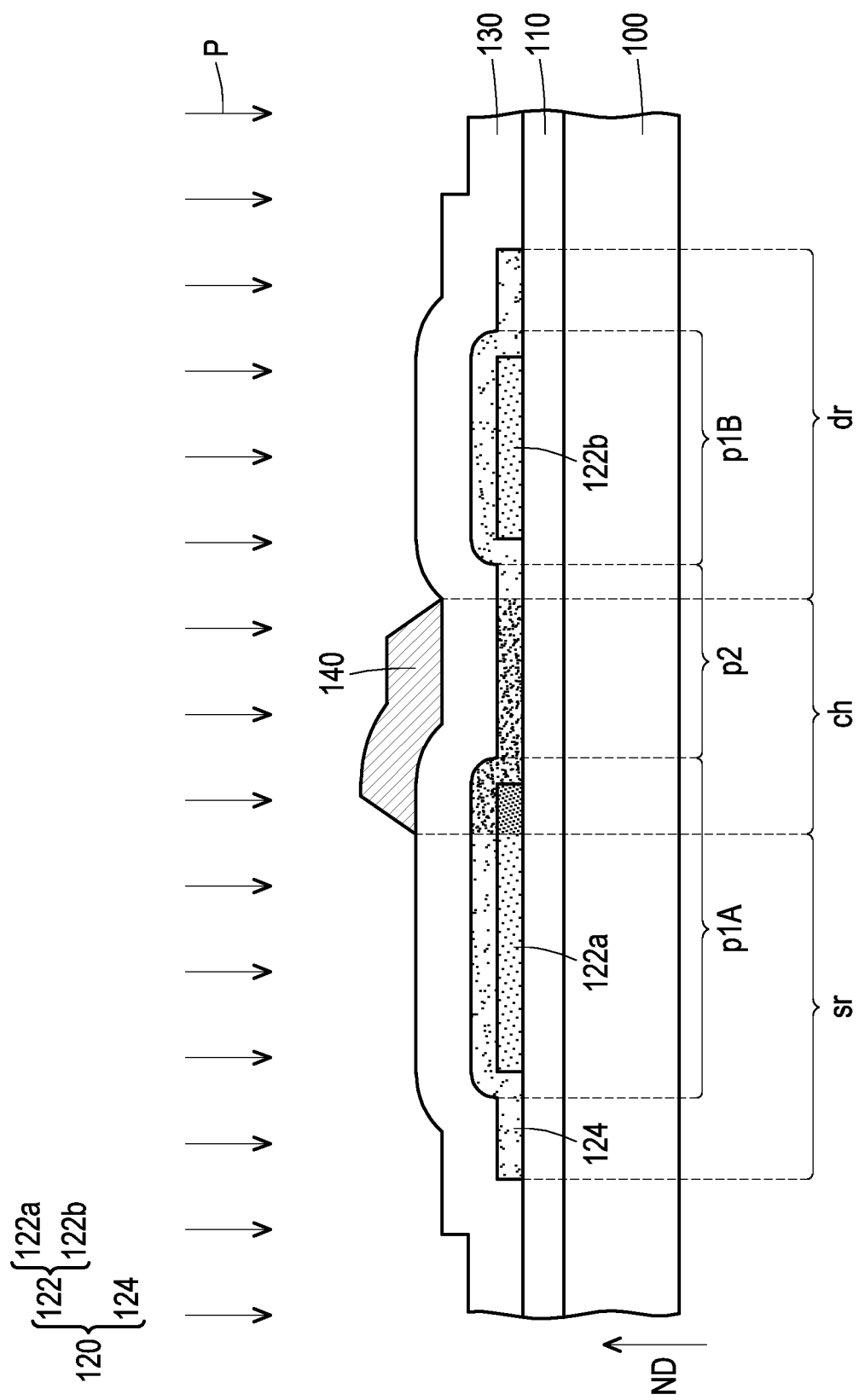

With reference to FIG. 2C, the gate dielectric layer 130 is formed on the semiconductor structure 120'. The first gate 140 is formed on the gate dielectric layer 130. In some embodiments, the process of forming the first gate 140 includes dry etching or wet etching. The first gate 140 overlaps a portion of the first thick portion p1A and a portion of the thin portion p2 in the normal direction ND of the top surface of the substrate 100, and the first gate 140 does not overlap another portion of the first thick portion p1A, another portion of the thin portion p2 and the second thick portion p1B in the normal direction ND.

Next, using the first gate 140 as a mask, a doping process P is performed on the semiconductor structure 120' to form the semiconductor structure 120 including the channel region ch, the source region sr and the drain region dr. The doping concentration of the source region sr and the drain region dr is greater than the doping concentration of the channel region ch. The doping process P may be, for example, a hydrogen plasma process or an ion implantation process, but the disclosure is not limited thereto.

Figure 2D:
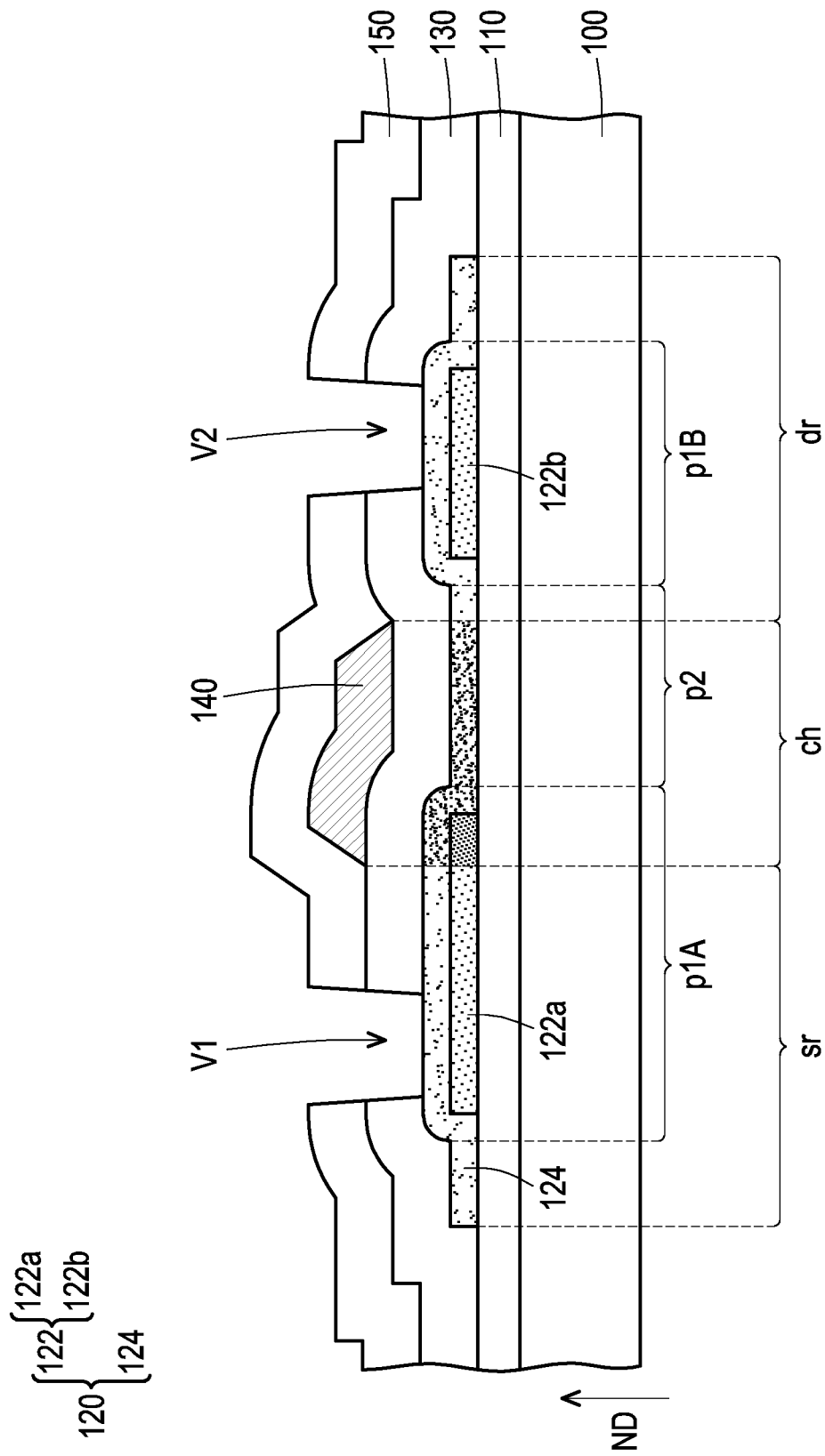

With reference to FIG. 2D, the interlayer dielectric layer 150 is formed on the gate dielectric layer 130 and covers the first gate 140. After that, the vias V1 and V2 are formed penetrating through the interlayer dielectric layer 150 and the gate dielectric layer 130, and the vias V1 and V2 respectively overlap the first thick portion p1A and the second thick portion p1B in the normal direction ND of the top surface of the substrate 100.

Then, with reference to FIG. 1, the source S and the drain D electrically connected to the first thick portion p1A and the second thick portion p1B, respectively, are formed. For example, the conductive layer 160 may be formed on the interlayer dielectric layer 150 and filled in the vias V1 and V2 to be electrically connected to the semiconductor structure 120. The conductive layer 160 may include the source S and the drain D, which are electrically connected to the first thick portion p1A and the second thick portion p1B through the vias V1 and V2, respectively.

After the above process, the fabrication of the semiconductor device TIA may be substantially completed.

Figure 3:
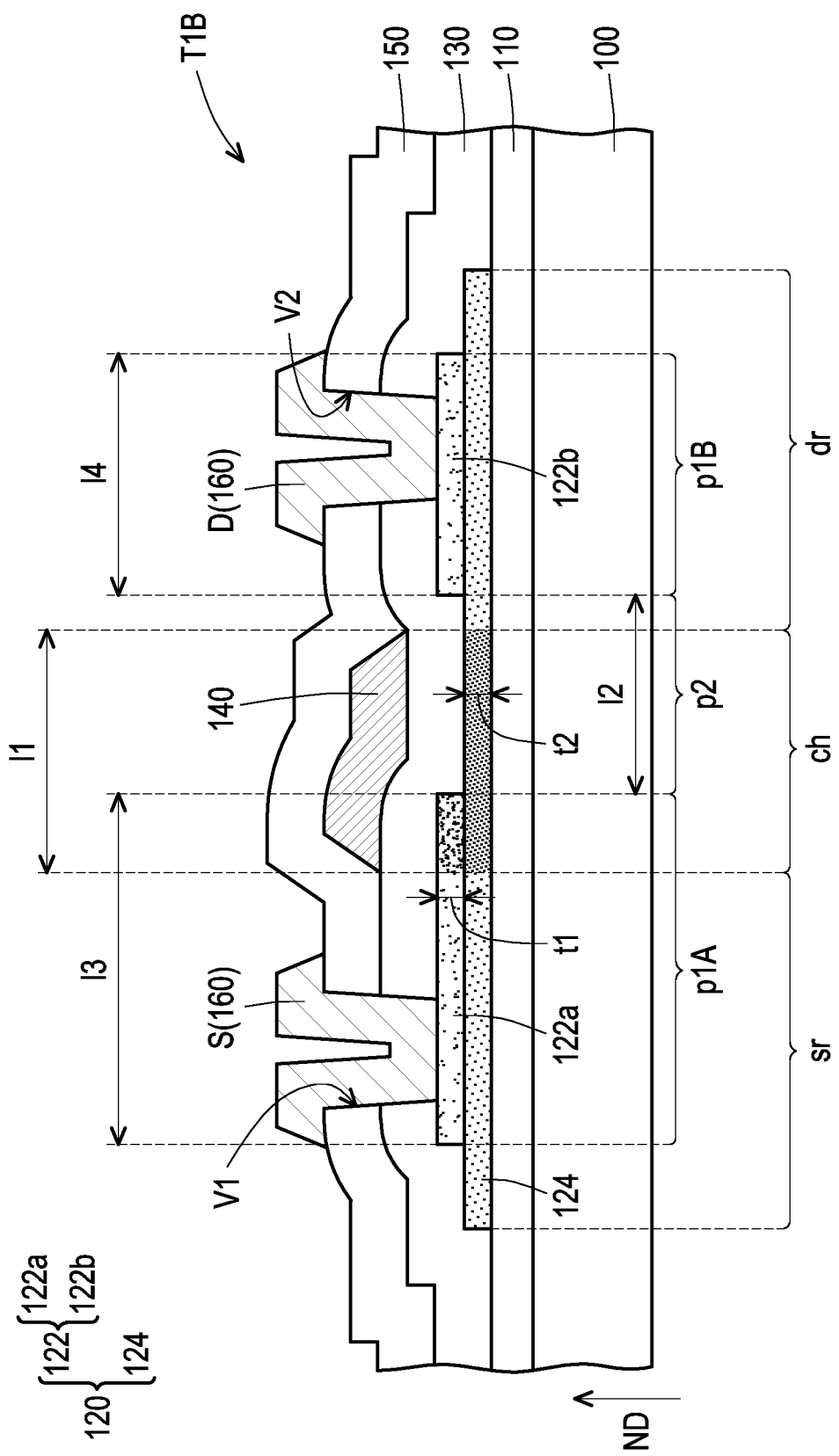
FIG. 3 is a schematic cross-sectional view of a semiconductor device according to another embodiment of the disclosure.

FIG. 3 is a schematic cross-sectional view of a semiconductor device according to another embodiment of the disclosure. It is noted here that the embodiment of FIG. 3 uses the reference numerals and some of the content of the embodiment of FIG. 1, and the same or similar reference numerals are used to represent the same or similar elements, and the description of the same technical content is omitted. For the description of the omitted portion, reference may be made to the foregoing embodiments, which will not be repeated here.

The main difference between the semiconductor device TIB of FIG. 3 and the semiconductor device TIA of FIG. 1 is that the second metal oxide layer 124 of the semiconductor device T1B is located between the first metal oxide layer 122 and the substrate 100. In addition, in this embodiment, the source S and the drain D are connected to the first metal oxide layer 122.

With reference to FIG. 3, the stacked portions of the first metal oxide layer 122 and the second metal oxide layer 124 may configure two thick portions of the semiconductor structure 120. For example, in this embodiment, the first metal oxide layer 122 includes a first island structure 122a and a second island structure 122b which are separated from each other. In this embodiment, the length l3 of the first island structure 122a is different from the length l4 of the second island structure 122b, but the disclosure is not limited thereto. In other embodiments, the length l3 of the first island structure 122a is equal to the length l4 of the second island structure 122b.

The second metal oxide layer 124 and the first island structure 122a are stacked on each other to form the first thick portion p1A, and the second metal oxide layer 124 and the second island structure 122b are stacked on each other to form the second thick portion p1B. The portion of the second metal oxide layer 124 between the first thick portion p1A and the second thick portion p1B may configure the thin portion p2. In other words, the thicknesses of the first thick portion p1A and the second thick portion p1B are substantially the sum of the thickness t1 of the first metal oxide layer 122 and the thickness t2 of the second metal oxide layer 124, and the thickness of the thin portion p2 is substantially equal to the thickness t2 of the second metal oxide layer 124. In some embodiments, the portions of the second metal oxide layer 124 located at the outer sides of the first thick portion p1A and the second thick portion p1B away from the thin portion p2 may also configure other thin portions.

In this embodiment, since the thickness of the portion of the drain region dr close to the channel region ch is thinner, the resistivity of the portion of the drain region dr connected to the channel region ch may be reduced, thereby reducing the hot carrier effect caused by the lateral electric field in the drain region dr. In addition, since the thickness of the portion of the source region sr close to the channel region ch is thicker, the increase in resistivity of the source region sr due to the reduction in thickness may be avoided.

In addition, although there are portions with different thicknesses in the channel region ch, since most of the current in the channel region ch is conducted on the surface of the channel region ch, the thickness change of the channel region ch has little effect on the resistivity of the channel region ch. In this embodiment, by disposing the first thick portion p1A below the first gate 140, the connection portion between the first thick portion p1A and the thin portion p2 is located in the channel region ch. In some embodiments, the first island structure 122a overlaps the first gate 140 in the normal direction ND, so as to prevent the process offset from causing the connection portion of the first thick portion p1A and the thin portion p2 to deviate from the channel area ch.

FIGS. 4A to 4D are schematic cross-sectional views of a manufacturing method of the semiconductor device of FIG. 3.

Figure 4A:
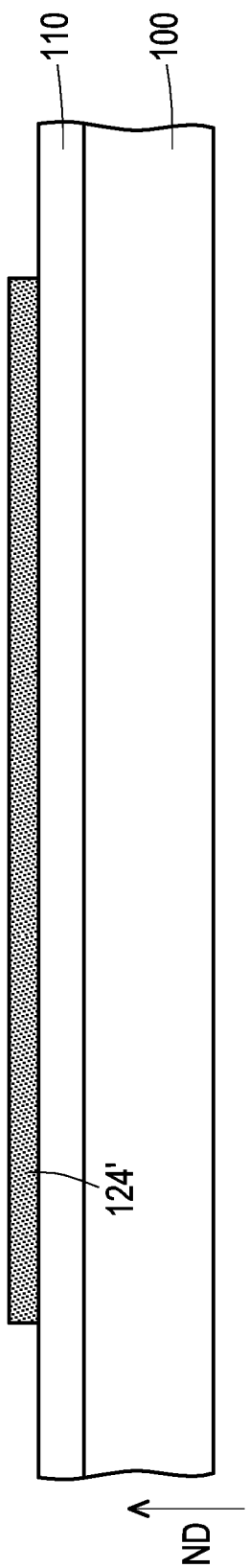
FIGS. 4A to 4D are schematic cross-sectional views of a manufacturing method of the semiconductor device of FIG. 3.
Figure 4B:
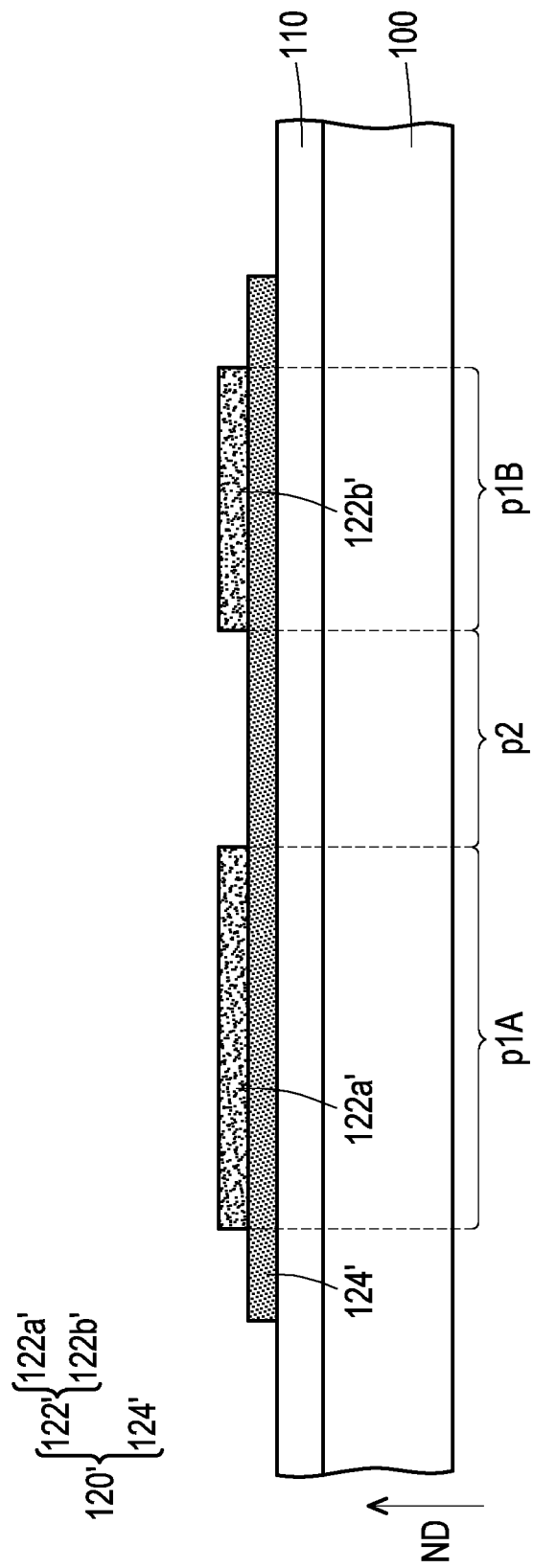

With reference to FIG. 4A and FIG. 4B, a semiconductor structure 120' is formed on the substrate 100. For example, the buffer layer 110 may be formed on the substrate 100 first, and then the semiconductor structure 120' may be formed on the buffer layer 110. The semiconductor structure 120' includes the first thick portion p1A, the second thick portion p1B, and the thin portion p2 between the first thick portion p1A and the second thick portion p1B.

In this embodiment, the method for forming the semiconductor structure 120' may be, for example, as shown in FIG. 4A, firstly forming a second metal oxide layer 124' on the buffer layer 110 and the substrate 100. Then, as shown in FIG. 4B, the first metal oxide layer 122' is formed on the second metal oxide layer 124', and the first metal oxide layer 122' includes the first island structure 122a' and the second island structure 122b' which are separated from each other.

In some embodiments, the oxygen concentration of the first metal oxide layer 122' is less than or equal to the oxygen concentration of the second metal oxide layer 124', thereby reducing the resistivity of the first thick portion p1A and the second thick portion p1B.

Figure 4C:
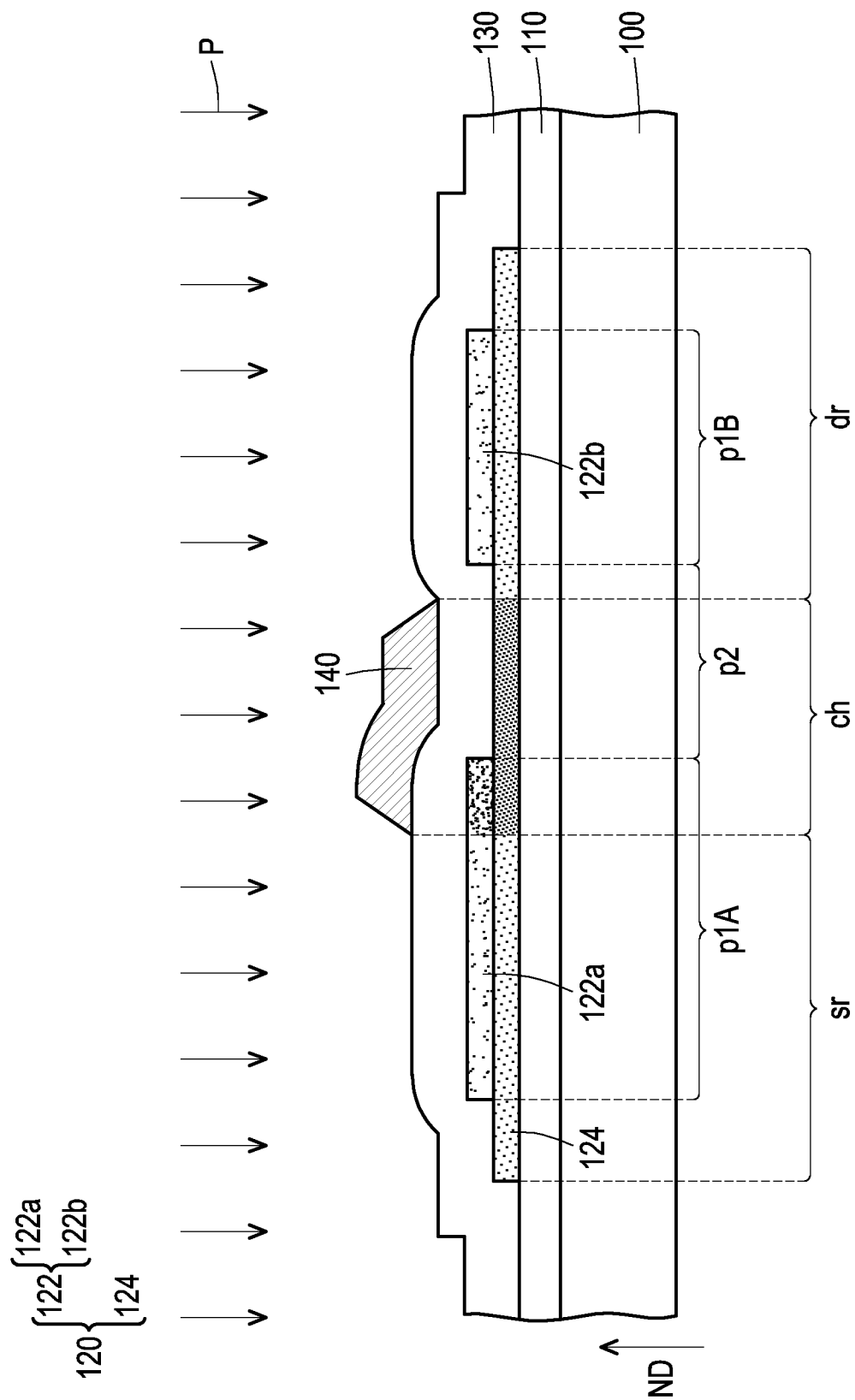

With reference to FIG. 4C, the gate dielectric layer 130 is formed on the semiconductor structure 120'. The first gate 140 is formed on the gate dielectric layer 130. In some embodiments, the process of forming the first gate 140 includes dry etching or wet etching. The first gate 140 overlaps a portion of the first thick portion p1A and a portion of the thin portion p2 in the normal direction ND of the top surface of the substrate 100, and the first gate 140 does not overlap another portion of the first thick portion p1A, another portion of the thin portion p2 and the second thick portion p1B in the normal direction ND.

Using the first gate 140 as a mask, a doping process P is performed on the semiconductor structure 120' to form the semiconductor structure 120 including the channel region ch, the source region sr and the drain region dr. The doping concentration of the source region sr and the drain region dr is greater than the doping concentration of the channel region ch. The doping process P may be, for example, a hydrogen plasma process or an ion implantation process, but the disclosure is not limited thereto.

Figure 4D:
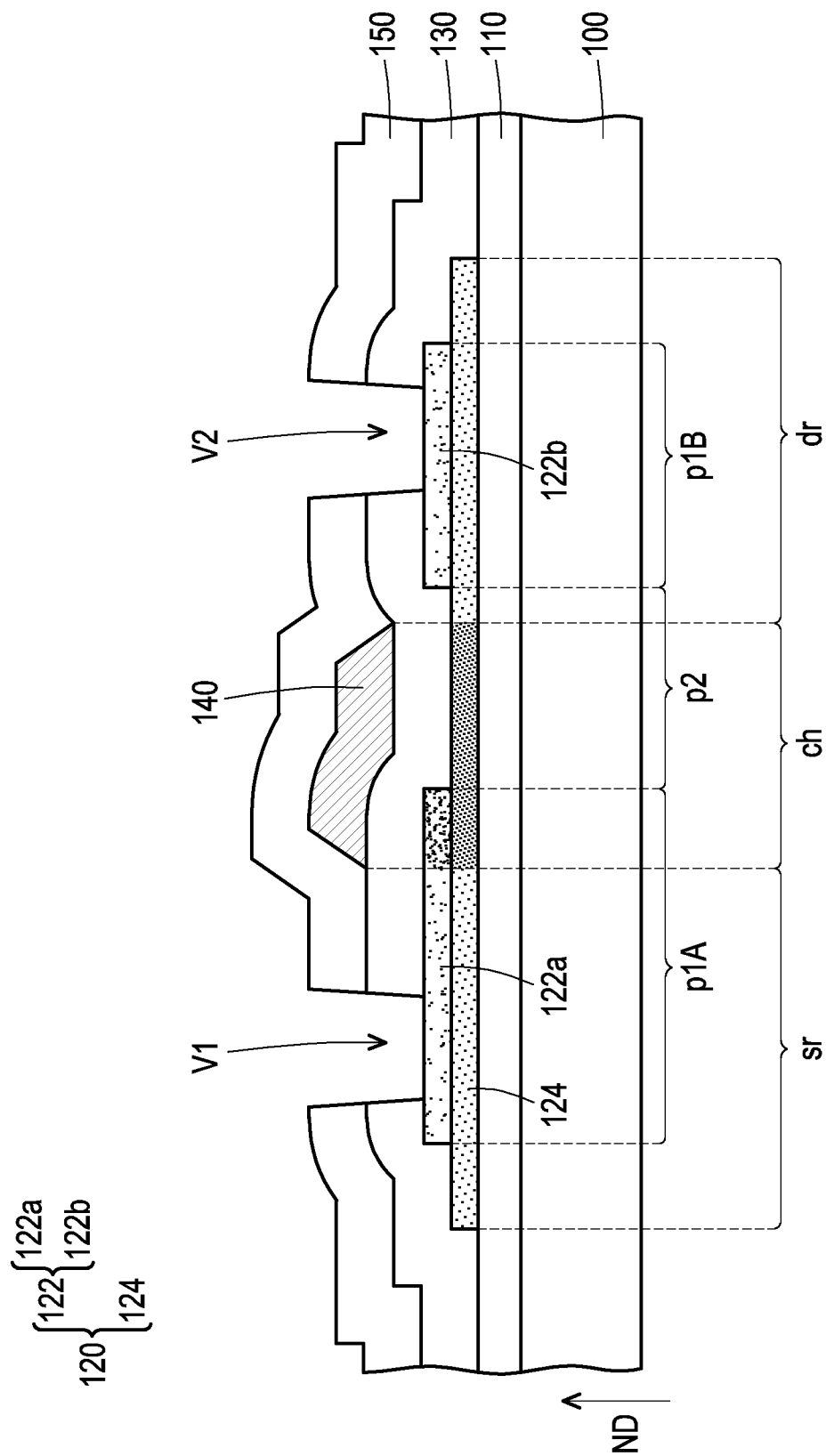

With reference to FIG. 4D, the interlayer dielectric layer 150 is formed on the gate dielectric layer 130 and covers the first gate 140. After that, the vias V1 and V2 are formed penetrating through the interlayer dielectric layer 150 and the gate dielectric layer 130, and the vias V1 and V2 respectively overlap the first thick portion p1A and the second thick portion p1B in the normal direction ND of the top surface of the substrate 100.

Then, with reference to FIG. 3, the source S and the drain D electrically connected to the first thick portion p1A and the second thick portion p1B, respectively, are formed. For example, the conductive layer 160 may be formed on the interlayer dielectric layer 150 and filled in the vias V1 and V2 to be electrically connected to the semiconductor structure 120. The conductive layer 160 may include the source S and the drain D, which are electrically connected to the first thick portion p1A and the second thick portion p1B through the vias V1 and V2, respectively.

After the above process, the fabrication of the semiconductor device T1B may be substantially completed.

Figure 5:
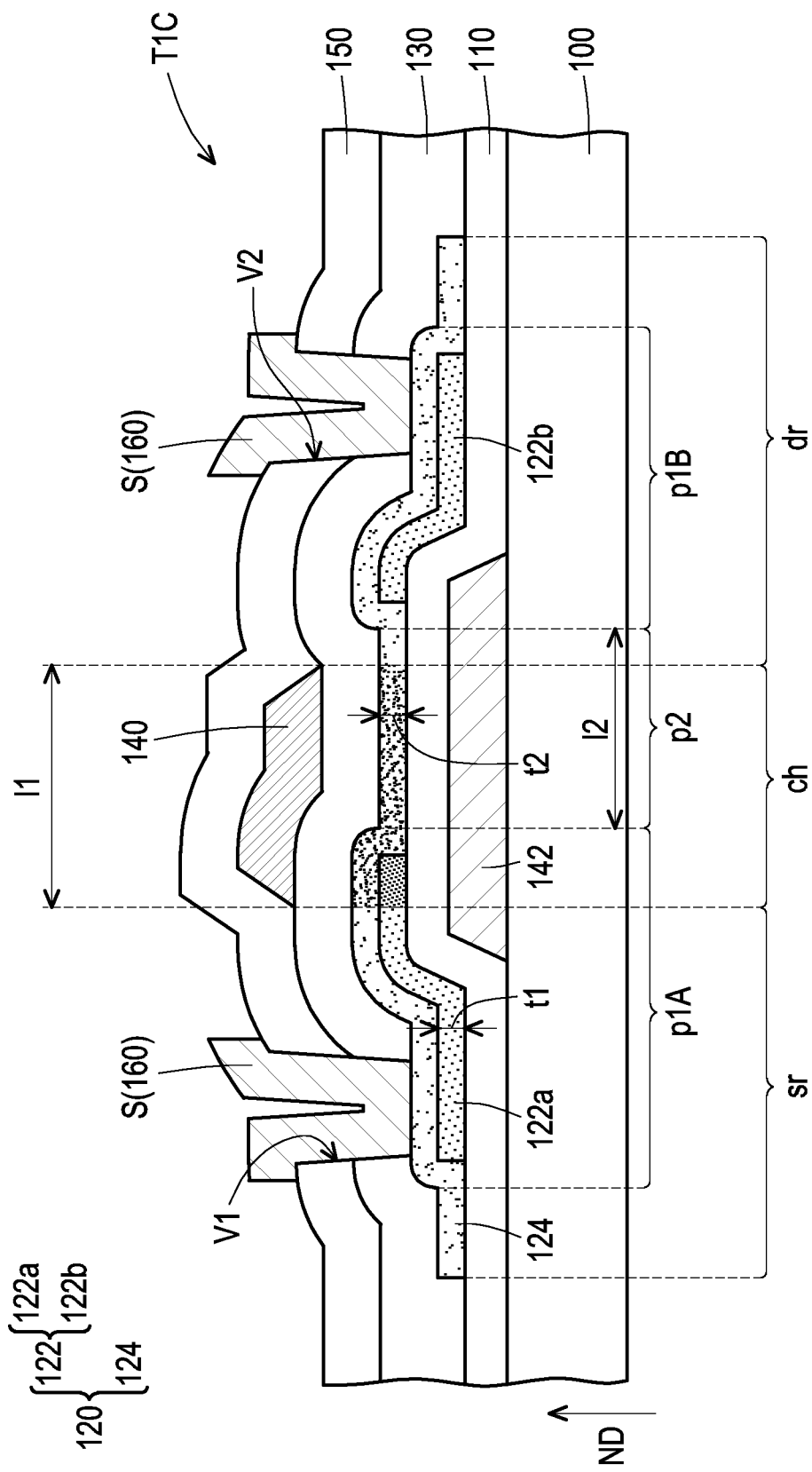
FIG. 5 is a schematic cross-sectional view of a semiconductor device according to an embodiment of the disclosure.

FIG. 5 is a schematic cross-sectional view of a semiconductor device according to another embodiment of the disclosure. It is noted here that the embodiment of FIG. 5 uses the reference numerals and some of the content of the embodiment of FIG. 1, and the same or similar reference numerals are used to represent the same or similar elements, and the description of the same technical content is omitted. For the description of the omitted portion, reference may be made to the foregoing embodiments, which will not be repeated here.

The main difference between the semiconductor device T1C of FIG. 5 and the semiconductor device T1A of FIG. 1 is that the semiconductor device T1C is a dual gate transistor, which further includes a second gate 142.

With reference to FIG. 5, the second gate 142 overlaps a portion of the first thick portion p1A, a portion of the second thick portion p1B and the thin portion p2 in the normal direction ND of the top surface of the substrate 100. In some embodiments, the area of the second gate 142 overlapping the first thick portion p1A is larger than the area of the second gate 142 overlapping the second thick portion p1B, but the disclosure is not limited thereto. In some embodiments, a portion of the first island structure 122a is located between the first gate 140 and the second gate 142.

In this embodiment, the disposition of the second gate 142 may increase the turn-on current of the semiconductor device T1C.

Figure 6:
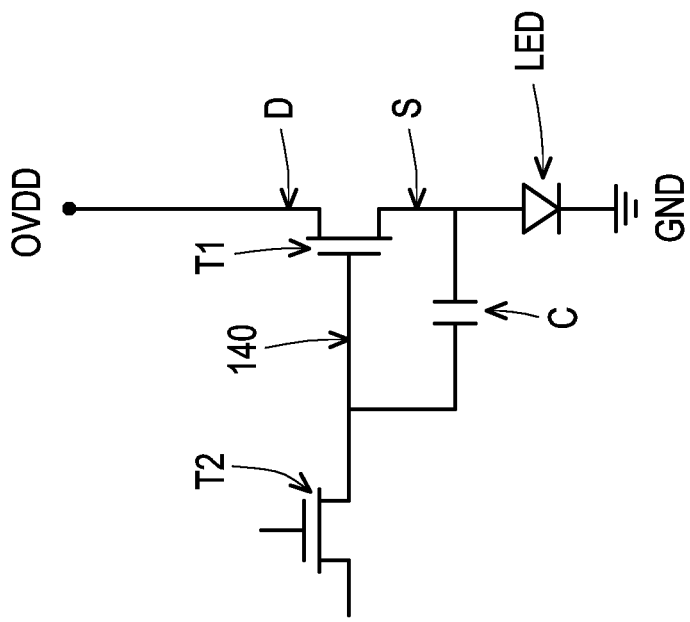
FIG. 6 is a schematic view of a pixel circuit according to an embodiment of the disclosure.

FIG. 6 is a schematic view of a pixel circuit according to an embodiment of the disclosure.

With reference to FIG. 6, in this embodiment, the pixel circuit includes a driving element T1, a switching element T2, a capacitor C, and a light emitting diode LED. In some embodiments, the light emitting diode LED is an organic light emitting diode or an inorganic light emitting diode. The semiconductor device T1A of FIG. 1, the semiconductor device T1B of FIG. 3, and the semiconductor device T1C of FIG. 5 may all be used as the driving element T1 of the pixel circuit of FIG. 6. For the specific structure of the driving element T1, reference may be made to the related contents of FIG. 1, FIG. 3 and FIG. 5, which will not be repeated here.

The first gate 140 of the driving element T1 is electrically connected to the source or drain of the switching element T2 and one terminal of the capacitor C. The drain D of the driving element T1 is electrically connected to the voltage OVDD. The source S of the driving element T1 is electrically connected to one terminal of the light emitting diode LED and the other terminal of the capacitor C. The other terminal of the light emitting diode LED is electrically connected to the ground voltage GND.

In this embodiment, the voltage OVDD is greater than the ground voltage GND. Therefore, when the driving element T1 is turned on, the current flows from the drain D to the source S, and lights the light emitting diode LED.

Figure 7:
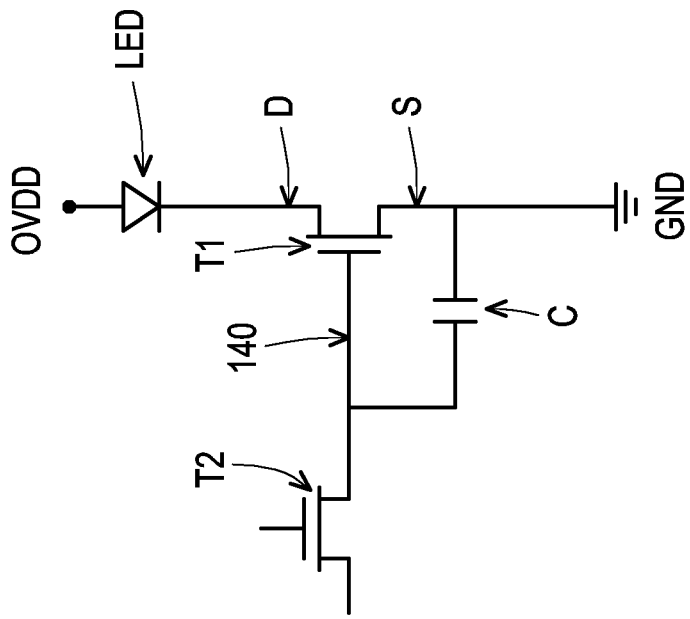
FIG. 7 is a schematic view of a pixel circuit according to another embodiment of the disclosure.

FIG. 7 is a schematic view of a pixel circuit according to an embodiment of the disclosure.

With reference to FIG. 7, in this embodiment, the pixel circuit includes a driving element T1, a switching element T2, a capacitor C, and a light emitting diode LED. In some embodiments, the light emitting diode LED is an organic light emitting diode or an inorganic light emitting diode. The semiconductor device T1A of FIG. 1, the semiconductor device T1B of FIG. 3, and the semiconductor device T1C of FIG. 5 may all be used as the driving element T1 of the pixel circuit of FIG. 7. For the specific structure of the driving element T1, reference may be made to the related contents of FIG. 1, FIG. 3 and FIG. 5, which will not be repeated here.

The first gate 140 of the driving element T1 is electrically connected to the source or drain of the switching element T2 and one terminal of the capacitor C. The drain D of the driving element T1 is electrically connected to one terminal of the light emitting diode LED. The source S of the driving element T1 is electrically connected to the other terminal of the capacitor C and the ground voltage GND. The other terminal of the light emitting diode LED is electrically connected to the voltage OVDD.

In this embodiment, the voltage OVDD is greater than the ground voltage GND. Therefore, when the driving element T1 is turned on, the current flows from the drain D to the source S after passing through the light emitting diode LED.

What is claimed is:

1. A semiconductor device comprising:
    a substrate;
    a semiconductor structure disposed on the substrate, wherein the semiconductor structure comprises:
        a first metal oxide layer comprising a first island structure and a second island structure separated from each other in a first direction; and
        a second metal oxide layer overlapping the first island structure and the second island structure, wherein the second metal oxide layer and the first island structure are stacked on each other to form a first thick portion, the second metal oxide layer and the second island structure are stacked on each other to form a second thick portion, and a portion of the second metal oxide layer between the first island structure and the second island structure forms a thin portion located between the first thick portion and the second thick portion, wherein a thickness of the first thick portion is greater than a thickness of the thin portion, a thickness of the second thick portion is greater than the thickness of the thin portion, and the first thick portion, the thin portion, and the second thick portion are connected in sequence along the first direction;
    a gate dielectric layer disposed on the semiconductor structure;
    a first gate disposed on the gate dielectric layer, wherein the first gate overlaps a portion of the first thick portion and a portion of the thin portion in a normal direction of a top surface of the substrate, and the first gate does not overlap another portion of the thin portion and the second thick portion in the normal direction of the top surface of the substrate;
    a source electrically connected to the first thick portion; and
    a drain electrically connected to the second thick portion.

2. The semiconductor device according to claim 1, wherein a length of the first island structure is different from a length of the second island structure.

3. The semiconductor device according to claim 1, wherein the first island structure partially overlaps the first gate in the normal direction.

4. The semiconductor device according to claim 1, wherein the semiconductor structure comprises a source region, a drain region, and a channel region between the source region and the drain region, wherein the channel region comprises a portion of the first thick portion overlapping the first gate in the normal direction and a portion of the thin portion overlapping the first gate in the normal direction.

5. The semiconductor device according to claim 4, wherein the drain region comprises a portion of the thin portion that does not overlap the first gate in the normal direction and the second thick portion.

6. The semiconductor device according to claim 4, wherein the source region comprises a portion of the first thick portion that does not overlap the first gate in the normal direction.

7. The semiconductor device according to claim 4, further comprising:
    a second gate that overlaps a portion of the first thick portion, a portion of the second thick portion and the thin portion in the normal direction.

8. A manufacturing method of a semiconductor device, comprising:
    forming a semiconductor structure on a substrate, wherein the semiconductor structure comprises:
        a first metal oxide layer comprising a first island structure and a second island structure separated from each other in a first direction; and
        a second metal oxide layer overlapping the first island structure and the second island structure, wherein the second metal oxide layer and the first island structure are stacked on each other to form a first thick portion, the second metal oxide layer and the second island structure are stacked on each other to form a second thick portion, and a portion of the second metal oxide layer between the first island structure and the second island structure forms a thin portion located between the first thick portion and the second thick portion, wherein a thickness of the first thick portion is greater than a thickness of the thin portion, a thickness of the second thick portion is greater than the thickness of the thin portion, and the first thick portion, the thin portion, and the second thick portion are connected in sequence along the first direction;
    forming a gate dielectric layer on the semiconductor structure;
    forming a first gate on the gate dielectric layer, wherein the first gate overlaps a portion of the first thick portion and a portion of the thin portion in a normal direction of a top surface of the substrate, and the first gate does not overlap another portion of the thin portion and the second thick portion in the normal direction of the top surface of the substrate; and
    forming a source electrically connected to the first thick portion and a drain electrically connected to the second thick portion.

9. The manufacturing method of the semiconductor device according to claim 8, further comprising:
    performing a doping process on the semiconductor structure using the first gate as a mask to form a source region, a drain region and a channel region between the source region and the drain region in the semiconductor structure, wherein the channel region comprises a portion of the first thick portion overlapping the first gate in the normal direction and a portion of the thin portion overlapping the first gate in the normal direction, and the drain region comprises a portion of the thin portion that does not overlap the first gate in the normal direction and the second thick portion, and the source region comprises a portion of the first thick portion that does not overlap the first gate in the normal direction.

10. The semiconductor device according to claim 1, wherein a portion of the second metal oxide layer is not stacked on the first metal oxide layer to form the thin portion located between the first thick portion and the second thick portion, wherein the first gate overlaps a portion of the first island structure in the normal direction of the top surface of the substrate, and the first gate does not overlap the second island structure in the normal direction of the top surface of the substrate.

11. The semiconductor device according to claim 1, wherein relative to the top surface of the substrate, a top surface of the first gate adjacent to the first thick portion is higher than that adjacent to the second thick portion.

12. The semiconductor device according to claim 1, wherein the portion of the second metal oxide layer extends continuously from the first island structure to the second island structure to form the thin portion.

* * * * *